United States Patent
Komaki et al.

(10) Patent No.: US 8,754,327 B2
(45) Date of Patent: Jun. 17, 2014

(54) GAS INSULATED DEVICE

(75) Inventors: Azumi Komaki, Kanagawa (JP); Toshihiro Hoshino, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 480 days.

(21) Appl. No.: 13/024,928

(22) Filed: Feb. 10, 2011

(65) Prior Publication Data

US 2011/0132632 A1    Jun. 9, 2011

Related U.S. Application Data

(63) Continuation-in-part of application No. PCT/JP2009/003847, filed on Aug. 11, 2009.

(30) Foreign Application Priority Data

Aug. 29, 2008    (JP) ................................ 2008-221845

(51) Int. Cl.
    *H01B 7/00*    (2006.01)
(52) U.S. Cl.
    USPC ........................... 174/24; 174/25 G; 174/26 R
(58) Field of Classification Search
    USPC .......... 174/14 R, 16.2, 28, 17 GF, 99 R, 68.2, 174/99 B; 361/604, 605, 611, 612
    See application file for complete search history.

(56) References Cited

U.S. PATENT DOCUMENTS

| | | | |
|---|---|---|---|
| 3,829,642 A * | 8/1974 | Graybill ........................... | 218/55 |
| 4,231,258 A * | 11/1980 | Menju et al. ...................... | 73/572 |
| 5,798,484 A * | 8/1998 | Yamagiwa et al. .......... | 174/14 R |
| 2005/0285604 A1 | 12/2005 | Shinohara | |
| 2006/0254791 A1 * | 11/2006 | Hama et al. .................. | 174/22 C |
| 2011/0005809 A1 * | 1/2011 | Sologuren-Sanchez et al. .............................. | 174/168 |

FOREIGN PATENT DOCUMENTS

| | | | |
|---|---|---|---|
| JP | 54-155495 | 12/1979 | |
| JP | 58-165615 | 9/1983 | |
| JP | 60-144708 | 9/1985 | |
| JP | 61-158627 | 7/1986 | |
| JP | 63-056112 | * 3/1988 | ............... H02G 5/06 |

(Continued)

OTHER PUBLICATIONS

English translation of International Preliminary Report on Patentability and Written Opinion of the International Searching Authority issued Apr. 21, 2011, in PCT/JP2009/003847.

(Continued)

*Primary Examiner* — William H Mayo, III
(74) *Attorney, Agent, or Firm* — Oblon, Spivak, McClelland, Maier & Neustadt, L.L.P.

(57) ABSTRACT

A gas insulated device includes a grounded metal container that covers a high-voltage conductor with a space interposed between itself and the high-voltage conductor; and an insulating spacer that is held and fixed between an end flanges on its outer side and supports the high-voltage conductor on its inner side. The insulating spacer has an internal shield that is buried in the insulating portion so as to surround the high-voltage conductor; grounding bars having conductivity whose one end is electrically connected to the internal shield and the other end extends to the outside of the insulating portion so as to be connected to the grounded metal container; a measurement bar having conductivity whose one end is electrically connected to the internal shield and other end extends to the outside of the insulating portion so as to be connected to the partial discharge measurement terminal.

3 Claims, 7 Drawing Sheets

(56) References Cited

FOREIGN PATENT DOCUMENTS

| | | |
|---|---|---|
| JP | 63-56112 | 3/1988 |
| JP | 3-45113 | 2/1991 |
| JP | 2001-141773 | 5/2001 |
| JP | 2003-259515 | 9/2003 |
| JP | 2006-47285 | 2/2006 |
| WO | WO 2010/023830 A1 | 3/2010 |

OTHER PUBLICATIONS

International Search Report Issued Sep. 15, 2009 in PCT/JP2009/003847 filed Aug. 11, 2009 (with English Translation).

Toshihiro Hoshino et al., "A Unique Sensitivity Verification Combined With Real-Time Partial-Discharge Identification Method", IEEE Transactions of Power Delivery, vol. 20, No. 3, Jul. 2005, pp. 1890-1896.

* cited by examiner

GAS INSULATED DEVICE

CROSS REFERENCES TO RELATED APPLICATIONS

This application is a continuation-in-part (CIP) application based upon the International Application PCT/JP2009/003847, the International Filing Date of which is Aug. 11, 2009, the entire content of which is incorporated herein by reference, and claims the benefit of priority from the prior Japanese Patent Application No. 2008-221845, filed in the Japanese Patent Office on Aug. 29, 2008, the entire content of which is incorporated herein by reference.

FIELD

Embodiments described herein relate to a gas insulated device such as a gas insulated switchgear.

BACKGROUND

A gas insulated device used for power distribution purposes in an electric power substation, such as a gas insulated switchgear, a gas insulated circuit breaker, or gas insulated bus bar, has a grounded sealed metal container in which a high-voltage conductor is accommodated. Further, the sealed metal container is filled with an inert insulating gas such as $SF_6$ and is thereby insulated. With this construction, the insulation performance is improved, and thereby the size of the electrical device can be reduced and safety thereof can be improved as compared to a conventional air insulated or oil insulated electrical device.

When a contact failure or incorporation of metal foreign matters occurs in the grounded metal container of the gas insulated device, the insulation performance is degraded at that portion, which may result in occurrence of partial discharge. If this partial discharge is left untreated, a breakdown occurs, which may lead to a serious accident.

In order to prevent occurrence of such a serious accident, it is necessary to detect and deal with the degradation in insulation performance in the grounded metal container in the early stage. Under such circumstances, an insulation diagnosis technique such as a partial discharge detector for detecting the partial discharge caused by the degradation in insulation performance is now under development.

Recently, from the point of view of achievement of long-term and stable operation of the device, so-called a UHF method has been used as an external diagnosis method for performing status monitoring. The UHF method is a method for measuring an UHF-band (0.3 to 3 GHz) partial discharge signal and is now ready for standardization by the IEC (International Electrotechnical Commission).

Generally, in the UHF method, an electrode (antenna) provided in the grounded metal container is used to detect a high-frequency electromagnetic wave induced by the partial discharge. The insulation diagnosis can be achieved by detecting the partial discharge at this time. Such an electrode for partial discharge detection is an electrode for detecting a high-frequency electromagnetic wave, so that two electrodes, i.e., a detection electrode and a ground side electrode, are required.

These electrodes are arranged so as to be electrically insulated from each other. There is known a method as disclosed in Japanese Patent Application Laid-Open Publication No. 2001-141773, the entire content of which is incorporated herein by reference, in which the shapes of the two electrodes and arrangement thereof are modified to improve the detection performance of the two electrodes.

Further, as disclosed in Japanese Patent Application Laid-Open Publication No. 63-056112, the entire content of which is incorporated herein by reference, there has conventionally been known an insulation diagnosis method in which an internal shield buried in an insulating spacer is used as an antenna for partial discharge detection to detect the partial discharge in a state where a measurement voltage is decreased by inserting a resistor between the internal shield and a measurement unit.

A common type gas insulated device disclosed in Japanese Patent Application Laid-Open Publication No. 63-056112 is constituted by a high-voltage conductor, a grounded metal container including the high-voltage conductor inserted thereinto and encapsulating an insulating gas such as $SF_6$ gas, and an insulating spacer supporting the high-voltage conductor. The insulating spacer includes a spacer main body and a metal flange formed at the outer periphery of the spacer main body. The spacer main body includes an insulating portion. A high-voltage side internal electrode and a ground side internal shield are integrally formed in a buried manner in the insulating portion.

A female screw portion is formed in the metal flange. The female screw portion is fixed to the metal flange formed in the grounded metal container by fastening means such as bolts.

The metal flange is integrally fixed by a metal member to the spacer main body. That is, the spacer main body and the metal flange have different structures from each other. At least four depressed portions are formed in the outer peripheral potion of the spacer main body and the inner peripheral portion of the metal flange. The metal member is fitted in the depressed portions.

These depressed portions and metal member are formed so as to hold the spacer main body and metal flange in the axial and radial directions of the insulating spacer. Further, the metal member is fastened and fixed to the metal flange by bolts.

The potential of the internal shield buried in the spacer main body is maintained by connecting the internal shield a bar attached to the metal member. Further, a contact metal material electrically connected to the bar protruded from the internal shield is provided in the metal flange. A resistor element and the like are arranged inside the contact metal material.

A voltage divided by a resistance value of the resistor element is detected by a partial discharge measurement device as a partial discharge signal.

However, the conventional gas insulated device has the following technical problems.

The partial discharge detection unit uses the internal shield that is buried in the spacer main body of the insulating spacer that supports the high-voltage conductor as an antenna for detecting a high-frequency signal induced by the partial discharge. That is, a high-frequency signal propagating in the grounded metal container is detected by the internal shield inside the insulating spacer. In this method, the resistor element is inserted between the internal shield and measurement unit to decrease the measurement voltage for detection of the high-frequency signal.

However, in such a signal detection method, not only a UHF-band electromagnetic wave induced by the partial discharge but also, e.g., an inductive component of a commercial power frequency voltage flowing through the high-voltage conductor is detected. The resistance value of the resistor element is generally set with the detection of a commercial power frequency as a premise, so that if a high voltage, such as switching surge, caused at the time of opening/closing an disconnector is applied, the resistor element may be damaged.

The resistor element is designed with detection of a frequency of kHz order in mind. Thus, a plate is attached to a spring constituting the resistor element so as to make influence of the inductance negligible. Further, an insulating cylinder or the like is provided for the purpose of taking out the divided measurement voltage. Accordingly, the structure may become complicated.

That is, the conventional partial discharge detection unit using the internal shield has both a function of detecting a commercial power voltage having a comparatively low frequency and a function of detecting the partial discharge. Therefore, even in the case where only the partial discharge is required to be detected, the commercial power voltage is also detected at the same time, making it difficult to achieve effective detection of the partial discharge.

Generally, in the gas insulated device, a plurality of grounded metal containers are coupled to constitute a complicated pipe arrangement in order to meet various installation conditions such as an installation space condition. The gas insulated device includes a plurality of insulating spacers between adjacent grounded metal containers.

It is desirable that the gas insulated device having the plurality of grounded metal containers includes a plurality of partial discharge detection functions aimed at abnormality detection in order to make it easy to identify the location of abnormality. Thus, when a function for detecting the partial discharge is provided for each insulating spacer arranged between the adjacent grounded metal containers, it is possible to achieve partial discharge detection at a plurality of locations without newly providing a detection section.

However, it is not necessary that the commercial power voltage detection function is imparted to all the insulating spacer, and it is sufficient for the commercial power voltage detection function to be provided at one location. Therefore, the commercial power voltage detection function may be provided separately from the spacer.

BRIEF SUMMARY OF THE INVENTION

The present invention has been made to solve the above problems, and an object thereof is to extract a UHF-band partial discharge signal from the gas insulated device safely and stably for partial discharge measurement.

In order to achieve the object described above, there is presented a gas insulated device according to the present invention which is a gas insulated device comprising: a high-voltage conductor that extends in its axial direction; a grounded metal container that can be divided at least into two parts by end flanges and covers the high-voltage conductor with a space interposed between itself and the high-voltage conductor, a space being filled with insulating gas; a internal electrode that supports the high-voltage conductor and electrically connects thereto; an insulating portion having insulating performance that is held and fixed between the end flanges on its outer peripheral side and supports the high-voltage conductor on its inner peripheral side; a ring-shaped internal shield having conductivity that is buried in the insulating portion at a side near the end flanges so as to surround the high-voltage conductor; a grounded metal flange that is disposed at the outer periphery of the insulating portion and is held and fixed between the end flanges; a grounding bar having conductivity whose one end is electrically connected to the internal shield and the other end extends to the outside of the insulating portion so as to be connected to the grounded metal container; a partial discharge measurement terminal that is fixed to the outer peripheral side of the grounded metal flange; and a measurement bar having conductivity whose one end is electrically connected to the internal shield and other end extends to the outside of the insulating portion so as to be connected to the partial discharge measurement terminal.

According to the present invention, the UHF-band partial discharge signal can be safely and stably extracted for partial discharge measurement.

BRIEF DESCRIPTION OF THE DRAWINGS

The above and other features and advantages of the present invention will become apparent from the discussion hereinbelow of specific, illustrative embodiments thereof presented in conjunction with the accompanying drawings, in which.

DETAILED DESCRIPTION

An embodiment of a gas insulated device according to the present invention will be described below with reference to the accompanying drawings.

First, with reference to FIGS. 1 to 6, a configuration of the gas insulated device according to the present embodiment will be described.

Figure 1:
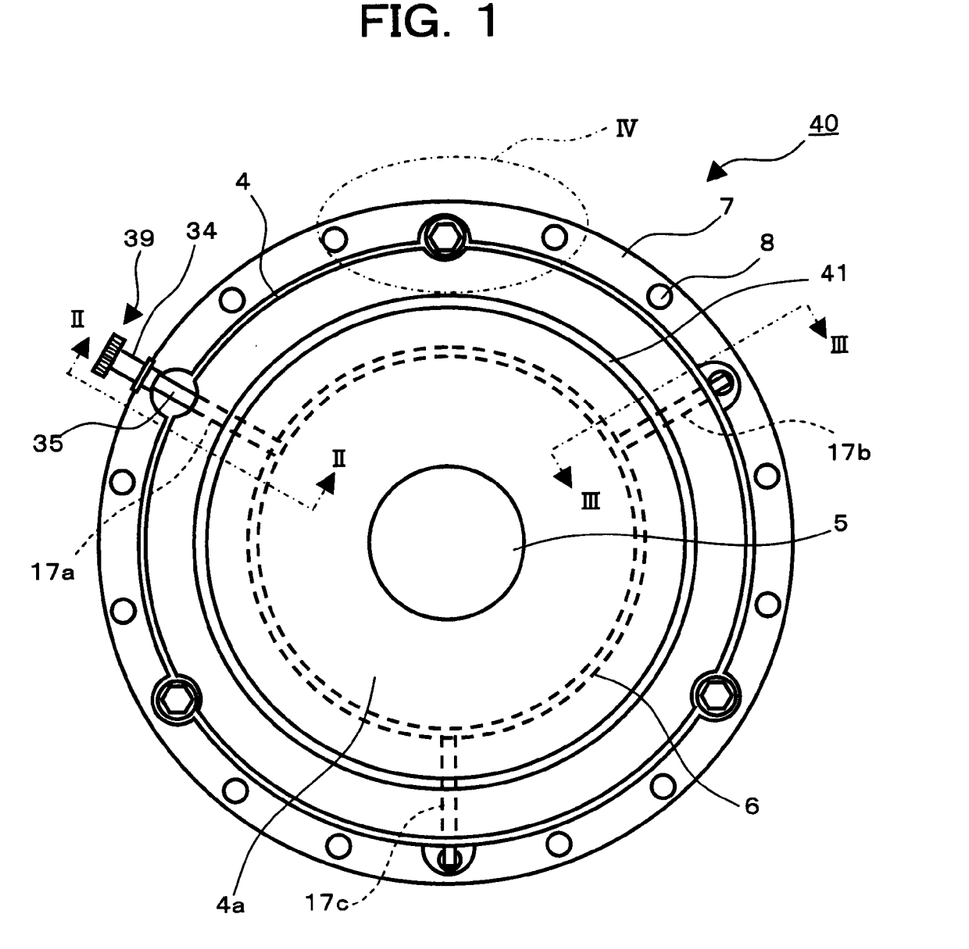
FIG. 1 is a plan view schematically showing an insulating spacer of a gas insulated device according to an embodiment of the present invention.
Figure 2:
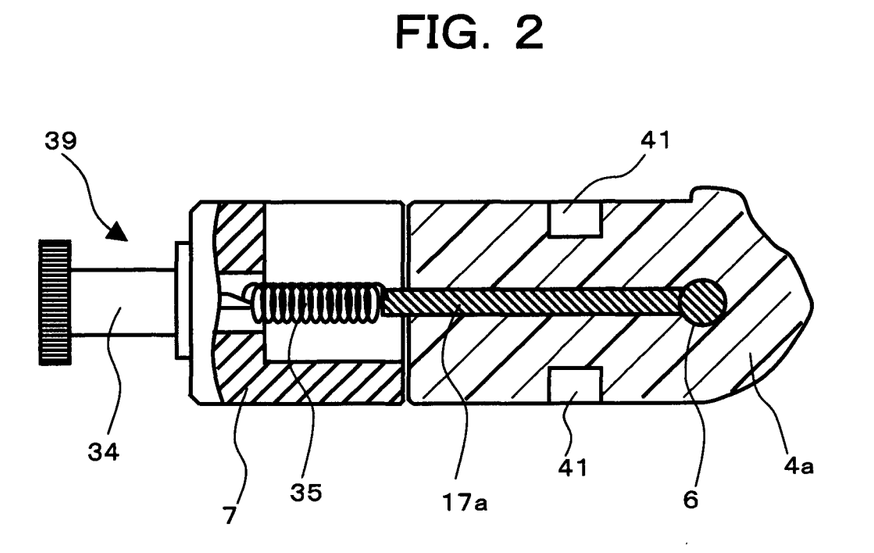
FIG. 2 is a partial side view showing a part of the cross-section of the insulating spacer taken along the line II-II of FIG. 1.
Figure 3:
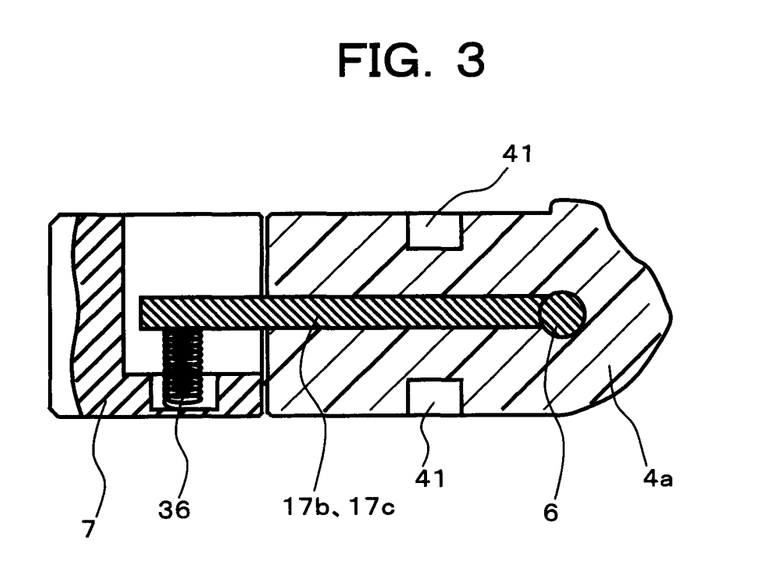
FIG. 3 is a partial side view showing a part of the cross-section of the insulating spacer taken along the line III-III of FIG. 1.
Figure 4:
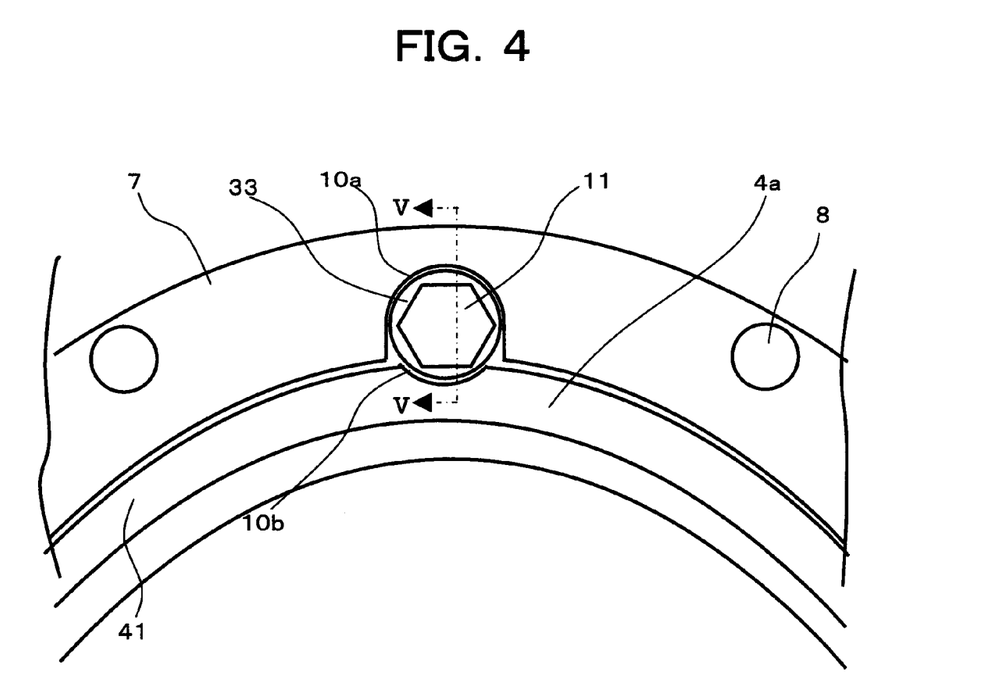
FIG. 4 is an enlarged plan view showing part "IV" of FIG. 1.
Figure 5:
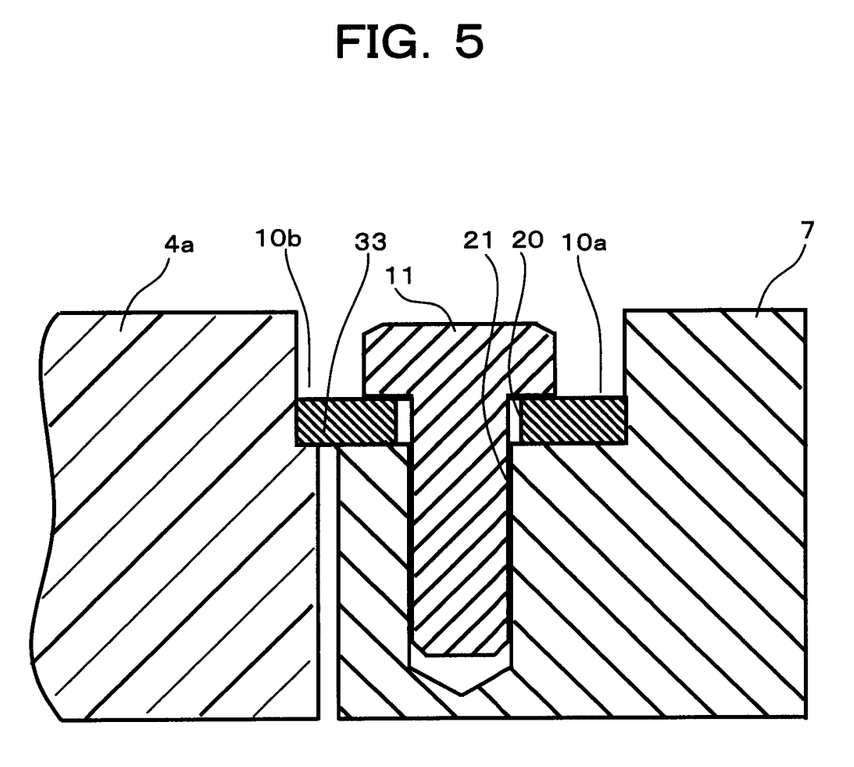
FIG. 5 is a cross-sectional view taken along the line V-V of FIG. 4.
Figure 6:
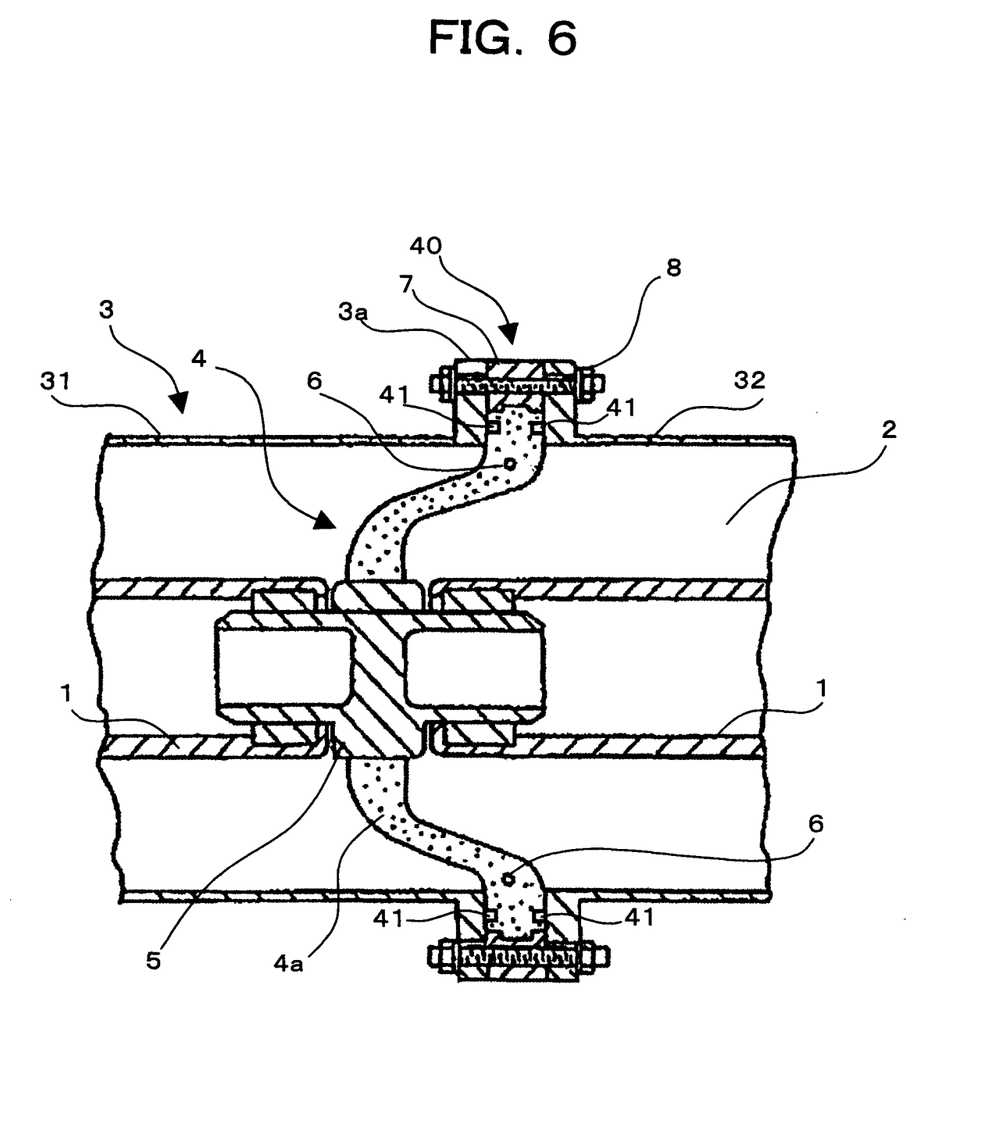
FIG. 6 is a cross-sectional view schematically showing a part of the gas insulated device according to the present embodiment.

FIG. 1 is a plan view schematically showing an insulating spacer 40 of the gas insulated device according to the present embodiment. FIG. 2 is a partial side view showing a part of the cross-section of the insulating spacer 40 taken along the line II-II of FIG. 1. FIG. 3 is a partial side view showing a part of the cross-section of the insulating spacer 40 taken along the line III-III of FIG. 1. FIG. 4 is an enlarged plan view showing IV part of FIG. 1. FIG. 5 is a cross-sectional view taken along the V-V line of FIG. 4. FIG. 6 is a cross-sectional view schematically showing a part of the gas insulated device according to the present embodiment.

As shown in FIG. 6, the gas insulated device according to the present embodiment has a grounded metal container 3, a high-voltage conductor 1 and an insulating spacer 40.

The grounded metal container 3 has a substantially cylindrical portion and is configured to be divided at least into first and second grounded metal containers 31 and 32 at a plane perpendicular to the axis of the substantially cylindrical portion.

End flange portions 3a are formed at the outer peripheries of the connecting portions of the first and second grounded metal containers 31 and 32. When the first and second grounded metal containers 31 and 32 are connected, the end flange portions 3a are fastened by fastening means such as fastening bolts 8 in the axial direction of the high-voltage conductor 1 with the insulating spacer 40 interposed therebetween.

The high-voltage conductor 1 is inserted into substantially the center portion of a space defined by the grounded metal container 3 along the center axis of the cylindrical portion. Further, an insulating gas 2 such as $SF_6$ gas is encapsulated inside the grounded metal container 3 at a space outside the high-voltage conductor 1.

The insulating spacer 40 includes an insulating spacer main body 4, an internal shield 6, an internal electrode 5 and a grounded metal flange 7.

The insulating spacer main body 4 includes an insulating portion 4a which is made of an insulating material and disposed so as to divide the inside of the grounded metal container 3 in the direction perpendicular to the center axis direction of the cylinder.

The outer peripheral side of the insulating portion 4a is held and fixed between the end flange portions 3a of the first and second grounded metal containers 31 and 32. The end flange portions 3a are fastened and fixed by fastening means such as fastening bolts 8. Seal O-rings are fitted and fastened in an O-ring grooves 41 formed in the insulating portion 4a for achieving airtightness. With this configuration, the insulating gas 2 is sealed in the grounded metal container 3, and a gas division is formed by the insulating spacer 40. The insulating spacer main boy 4 is configured to support the high-voltage conductor 1 inserted into the grounded metal container 3 at its center portion.

At the center portion of the insulating spacer main body 4, an internal electrode 5 is disposed inside the high-voltage conductor 1 so as to connect to and support the high-voltage conductor 1. The internal electrode 5 has a function of electrically connecting to the high-voltage conductor 1 disposed on both side thereof. The internal shield 6 is embedded in the insulating portion 4a on the side near the end flange portion 3a. The internal shield 6 is disposed so as to surround the high-voltage conductor 1 and is formed into, e.g., a ring. The internal shield 6 may be formed into a partial ring having discontinuous portions.

Three bars, i.e., a first bar 17a, a second bar 17b, and a third bar 17c, each having conductivity, are electrically connected to the internal shield 6. The first to third bars 17a, 17b and 17c are formed so as to extend in, e.g., radial, from the internal shield 6 to the outside of the insulating portion 4a.

The grounded metal flange 7 is provided outside the insulating portion 4a. Like the insulating portion 4a on the outer peripheral side of the insulating spacer main body 4, the grounded metal flange 7 is held and fixed by the end flange portions 3a of the first and second grounded metal containers 31 and 32.

As shown in FIGS. 4 and 5, in the gas insulated device, a disk-shaped insulating plate 33 made of a resin material (epoxy resin or polyacetal resin, for example) is disposed so as to press both the insulating spacer main body 4 of the insulating spacer 40 and the grounded metal flange 7 in the axial direction of the high-voltage conductor 1. The insulating plate 33 has a bolt through-hole 20 in the center thereof and is secured to the grounded metal flange 7 by a fixing bolt 11. That is, the grounded metal flange 7 is fitted to the insulating spacer main body 4 via the insulating plate 33 without directly contacting the insulating portion 4a of the insulating spacer main body 4.

A first depression portion 10a is formed in the grounded metal flange 7 on the plane perpendicular to the axial direction of the high-voltage conductor 1. A screw hole 21 is formed in the center of the first depression portion 10a in the axial direction of the high-voltage conductor 1. Further, a second depression portion 10b is formed in the insulating portion 4a at the position opposite to the first depression portion 10a with respect to the screw hole 21. The first and second depression portions 10a and 10b have substantially a circular shape as a whole. That is, the substantially circular depression formed by the first and second depression portions 10a and 10b is formed astride the insulating portion 4a and the grounded metal flange 7.

The insulating plate 33 is fitted in the substantially circular depression so as to press the insulating portion 4a and the grounded metal flange 7 in the axial direction of the high-voltage conductor 1.

As shown in FIG. 2, the first bar 17a is connected, via a connecting spring 35 made of stainless steel to a coaxial cable connecting terminal 34 capable of directly connecting to a coaxial cable. The connecting spring 35 is serially connected to the outside of the first bar 17a so as to elastically expand and contract in the longitudinal extending direction of the first bar 17a. The first bar 17a serves as a measurement bar for measuring the partial discharge and is one of the members that constitute a partial discharge measurement terminal 39.

As shown in FIG. 3, the second bar 17b and the third bar 17c each serves as a ground bar. The bars 17b and 17c are connected, for grounding, to the grounded metal flange 7 via a grounding spring 36 made of stainless steel. The grounding spring 36 is disposed between the grounding second bar 17b and the grounded metal flange 7 so as to electrically connect them. The grounding spring 36 is disposed so as to elastically expand and contract in the direction perpendicular to the longitudinal direction of the second bar 17b. The grounding spring 36 is also disposed between the third bar 17c and the grounded metal flange 7.

The operation of the gas insulated device according to the present embodiment will next be described with reference to FIGS. 7 to 9.

Figure 7:
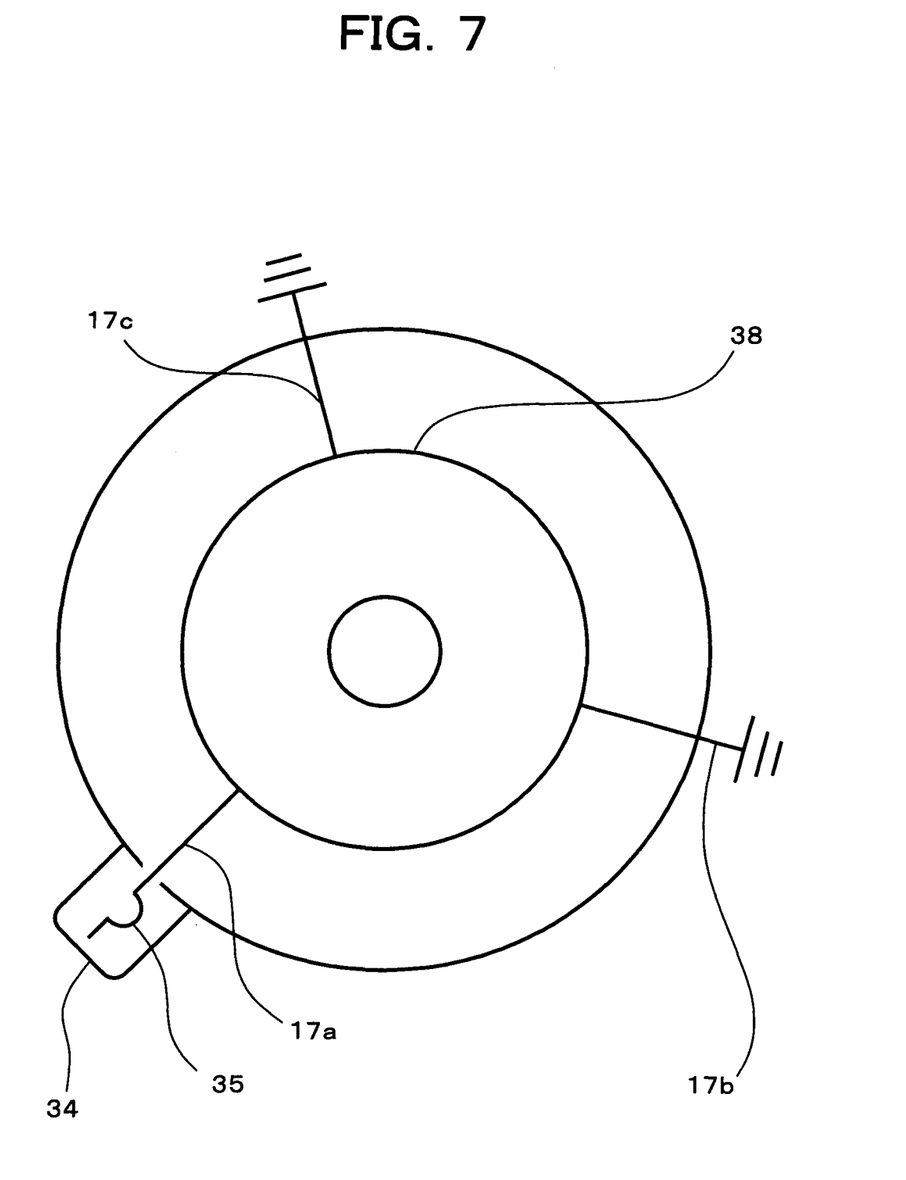
FIG. 7 is a view schematically showing a grounded state of the present embodiment.

FIG. 7 is a view schematically showing a grounded state of the present embodiment. FIG. 8 is a graph showing a relationship between time and voltage, in which a partial discharge signal detected by a conventional partial discharge detection unit using an internal shield is shown. FIG. 9 is a graph showing a relationship between time and voltage, in which a partial discharge signal detected by the insulating spacer 40 of the gas insulated device according to the embodiment shown in FIG. 1 is shown.

Even in a state where the end flange portions 3a of the first and second grounded metal containers 31 and 32 are fastened by the fastening bolts 8 with the insulating spacer main body 4 and the grounded metal flange 7 held therebetween, electrical conductivity between the first and second grounded metal containers 31 and 32 is established by the fastening bolts 8.

In the above described configuration, a conductive member such as a metal member is not protruded outside the grounded metal container 3 at a portion around the measurement bar (e.g., first bar 17). Thus, it is possible to prevent a measurement signal such as a partial discharge signal from attenuating due to leakage to the outside.

A conventional internal shield is an electrode that is buried in the insulating spacer main body for the purpose of alleviating occurrence of electrolyte at a convergence point between the grounded metal container, insulating gas, and insulating spacer main body, i.e., at a triple junction. That is, the conventional internal shield was not a component intended to detect the partial discharge.

On the other hand, in the gas insulated device according to the present embodiment, the partial discharge measurement terminal 39 having the first bar 17a is fixed to the grounded metal flange 7 via the connecting spring 35 and used as a means for detecting the partial discharge. That is, the gas insulated device according to the present embodiment uses a plurality of insulating spacers 40 provided in the gas insulated device to selectively detect the partial discharge (UHF signal) without detecting a commercial power voltage. Thus, a member for detecting the partial discharge such as a voltage detection sensor need not be provided newly, thereby simplifying the structure of the device.

Further, a use of the coaxial cable connecting terminal 34 capable of directly connecting to a coaxial cable excellent in detecting a high-frequency component as the partial discharge measurement terminal 39 allows further simplification of the device.

In the gas insulated device having the configuration described above, when a signal of the partial discharge occurs in the grounded metal container 3, an electromagnetic wave having a frequency of GHz order occurs and propagates in the grounded metal container 3. At this time, as shown in FIG. 7, the ring-shaped internal shield 6 embedded in the insulating spacer main body 4 and the first to third bars 17a to 17c serve as a loop antenna 38 to detect the propagating electromagnetic wave as a signal.

A partial discharge measurement unit using the internal shield 6 as a means for detecting the partial discharge is lower in manufacturing cost and thus be more economical than a system as disclosed in Japanese Patent Application Laid-Open Publication No. 2001-141773 in which an independent antenna electrode is provided.

Figure 8:
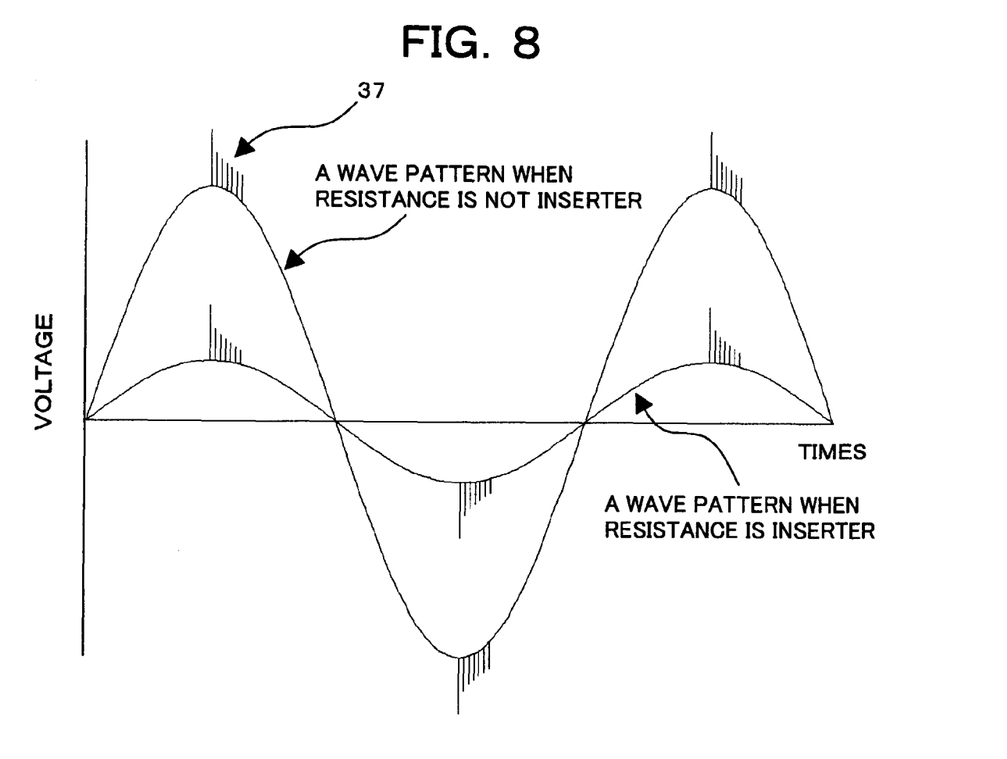
FIG. 8 is a graph showing a partial discharge signal detected by a conventional partial discharge detection unit using an internal shield.
Figure 9:
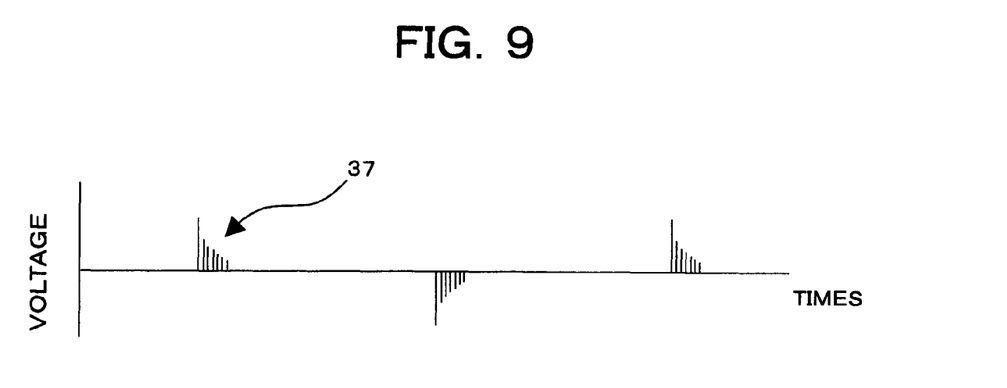
FIG. 9 is a graph showing a partial discharge signal detected by the insulating spacer of the gas insulated device according to the embodiment shown in FIG. 1.

Further, in the conventional system, the partial discharge signal 37 is superimposed on an induced voltage caused by a commercial power frequency voltage, as shown in FIG. 8. In this case, a resistor was provided to decrease a measurement voltage so as to detect the partial discharge signal. FIG. 8 shows an example in which a value of the measurement voltage is changed depending on presence/absence of a resistor. According to the present embodiment, it is possible to extract only a UHF-band (GHz order) at the partial discharge signal 37 while maintaining grounding, as shown in FIG. 9. After that, analysis is made based on the detected UHF-band signal to diagnose an insulated condition.

Further, the frequency of the signal to be detected is GHz order, so that the signal is not subject to attenuation due to an inductance of the connecting spring 35 used for connecting the internal shield 6 and a partial discharge measurement unit (not shown). Thus, the partial discharge can be detected and determined stably.

As described above, the function of detecting the commercial power voltage applied to the gas insulated device may separately be provided in the gas insulated device as a detection unit. The commercial power voltage detection function need not be imparted to all the insulating spacers 40 provided in the gas insulated device, and the number of commercial power voltage detection units may be smaller than that of units detecting the partial discharge.

By using the insulating spacer 40 as a unit dedicated to partial discharge detection as in the present embodiment, it is possible to detect the partial discharge signal more stably and safely.

Further, the connecting spring 35 and grounding spring 36 are each made of stainless steel, thereby preventing occurrence of rusting.

The connecting spring 35 is used to securely connect the insulating spacer main body 4 and the grounded metal flange 7, thereby absorbing manufacturing error (dimensional tolerance) between the components to be connected. As a result, manufacturing cost can be reduced.

The insulating plate 33 is made of resin, so that even when the insulating plate 33 is pressed to the insulating spacer main body 4 by means of the fixing bolt 11, damage of the insulating spacer main body 4 can be prevented.

As described above, according to the present embodiment, simplification and size reduction of especially the insulating spacer 40 can be achieved, as well as the UHF-band partial discharge signal can be safely and stably extracted for partial discharge measurement.

The embodiment described above is merely given as an example, and it should be understood that the present invention is not limited thereto. For example, the number of the grounding bars is not limited to two but may be one or three or more. Further, two or more measurement bars may be connected to one internal shield 6.

Further, the insulating gas space need not be divided by the insulating spacer 40.

What is claimed is:

1. A gas insulated device comprising:
   a high-voltage conductor that extends in its axial direction;
   a grounded metal container that can be divided at least into two parts by end flanges and covers the high-voltage conductor with a space interposed between itself and the high-voltage conductor, a space being filled with insulating gas;
   an internal electrode that supports the high-voltage conductor and electrically connects thereto;
   an insulating portion having insulating performance that is held and fixed between the end flanges on its outer peripheral side and supports the high-voltage conductor on its inner peripheral side;
   a ring-shaped internal shield having electric conductivity that is buried in the insulating portion at a side near the end flanges so as to surround the high-voltage conductor;
   a grounded metal flange that is disposed at the outer periphery of the insulating portion and is held and fixed between the end flanges;
   a grounding bar having electric conductivity whose one end is electrically connected to the internal shield and the other end extends to the outside of the insulating portion so as to be connected to the grounded metal container;
   a partial discharge measurement terminal that is fixed to the outer peripheral side of the grounded metal flange;
   a measurement bar having conductivity whose one end is electrically connected to the internal shield and other end extends to the outside of the insulating portion so as to be connected to the partial discharge measurement terminal;
   a connecting spring that is disposed between the partial discharge measurement terminal and the measurement bar so as to elastically expand and contract in a radial direction of the grounded metal container and electrically connects the partial discharge measurement terminal and the measurement bar; and
   a grounding spring that is disposed between the grounding bar and the grounded metal flange so as to elastically expand and contract in the longitudinal direction of the grounded metal container and electrically connects the grounding bar and the grounded metal frame.

2. The gas insulated device according to claim 1, wherein the partial discharge measurement terminal is a coaxial cable connecting terminal that can connect to a coaxial cable.

3. The gas insulated device according to claim 1, wherein a first depression portion is formed in the grounded metal flange on the plane perpendicular to an axial direction of the high-voltage conductor;

a screw hole is formed in the first depression portion so as to extend in the axial direction of the high-voltage conductor;

a second depression portion is formed in the insulating portion at a position opposite to the first depression portion so as to constitute a circular depression together with the first depression portion;

an insulating plate in which a bolt through-hole formed so as to penetrate the insulating plate from the front to back surfaces thereof is fitted in the circular depression; and a bolt is inserted into the bolt through-hole and installed in the screw hole so as to fasten the insulating plate to thereby allow the insulating plate to press both the insulating portion and the grounded metal flange in the axial direction of the high-voltage conductor for fixing.

\* \* \* \* \*